United States Patent
Quest-Matt et al.

(10) Patent No.: US 11,955,402 B2
(45) Date of Patent: Apr. 9, 2024

(54) POWER SEMICONDUCTOR COMPONENT AND METHOD FOR PRODUCING A POWER SEMICONDUCTOR COMPONENT

(71) Applicant: Vitesco Technologies GmbH, Regensburg (DE)

(72) Inventors: Christina Quest-Matt, Munich (DE); Detlev Bagung, Munich (DE); Daniela Wolf, Munich (DE)

(73) Assignee: Vitesco Technologies GbmH (DE)

(*) Notice: Subject to any disclaimer, the term of this patent is extended or adjusted under 35 U.S.C. 154(b) by 0 days.

(21) Appl. No.: 17/608,888

(22) PCT Filed: Oct. 6, 2020

(86) PCT No.: PCT/EP2020/078019
§ 371 (c)(1),
(2) Date: Nov. 4, 2021

(87) PCT Pub. No.: WO2021/069451
PCT Pub. Date: Apr. 15, 2021

(65) Prior Publication Data
US 2022/0328377 A1     Oct. 13, 2022

(30) Foreign Application Priority Data
Oct. 10, 2019   (DE) .................. 10 2019 215 503.0

(51) Int. Cl.
H01L 23/367   (2006.01)
H01L 21/48    (2006.01)
H01L 23/00    (2006.01)

(52) U.S. Cl.
CPC ...... *H01L 23/3677* (2013.01); *H01L 21/4871* (2013.01); *H01L 24/13* (2013.01);
(Continued)

(58) Field of Classification Search
CPC .............. H01L 23/3737; H01L 23/367; H01L 21/4875; H01L 2023/4068;
(Continued)

(56) References Cited

U.S. PATENT DOCUMENTS 5,646,826 A * 7/1997 Katchmar .......... H05K 7/20463
                                                  257/E23.09
5,951,305 A * 9/1999 Haba .................... H01R 12/57
                                                  439/70
(Continued)

FOREIGN PATENT DOCUMENTS

CN    101980360 A    2/2011
DE    3305167 A1     8/1984
(Continued)

OTHER PUBLICATIONS

English translation of Written Opinion for International Application No. PCT/EP2020/078019, dated Jan. 18, 2021, 4 pages.
(Continued)

*Primary Examiner* — Dale E Page
*Assistant Examiner* — Abbigale A Boyle
(74) *Attorney, Agent, or Firm* — Buchanan Ingersoll & Rooney PC

(57) ABSTRACT

A power semiconductor component is specified, having a power semiconductor device arranged within a housing, wherein a heat sink is exposed on a first surface of the housing; a wiring substrate which receives the housing with the power semiconductor device and which has a first main surface and a second main surface. A heat dissipation region with increased thermal conductivity is arranged on the second main surface. The housing is arranged on the wiring substrate in such a way that the heat sink is connected to the heat dissipation region via a solder layer. A number of spacers which are arranged between the heat sink and the
(Continued)

heat dissipation region are embedded in the solder layer. Furthermore, a method for producing a power semiconductor component is specified.

7 Claims, 1 Drawing Sheet

(52) U.S. Cl.
CPC .............. *H01L 24/27* (2013.01); *H01L 24/32* (2013.01); *H01L 24/73* (2013.01); *H01L 24/83* (2013.01); *H01L 2224/09519* (2013.01); *H01L 2224/1319* (2013.01); *H01L 2224/26152* (2013.01); *H01L 2224/27011* (2013.01); *H01L 2224/32225* (2013.01); *H01L 2224/73204* (2013.01); *H01L 2224/83104* (2013.01)

(58) Field of Classification Search
CPC ..... H01L 2224/0226; H01L 2224/0212; H01L 2224/02122; H01L 2224/02163; H01L 2224/0219
See application file for complete search history.

(56) References Cited

U.S. PATENT DOCUMENTS

| | | | |
|---|---|---|---|
| 7,057,891 B2 | 6/2006 | Ito et al. | |
| 8,653,651 B2* | 2/2014 | Uchida | H01L 24/83 |
| | | | 257/706 |
| 10,912,186 B2 | 2/2021 | Sato et al. | |
| 2006/0091509 A1 | 5/2006 | Zhao et al. | |
| 2020/0098660 A1* | 3/2020 | Wakaiki | H01L 21/4882 |

FOREIGN PATENT DOCUMENTS

| | | |
|---|---|---|
| DE | 19547680 A1 | 6/1997 |
| DE | 102004024616 A1 | 12/2004 |
| DE | 112016005508 T5 | 9/2018 |
| JP | 2018120991 A | 8/2018 |

OTHER PUBLICATIONS

International Search Report and Written Opinion for International Application No. PCT/EP2020/078019, dated Jan. 18, 2021, with partial English translation, 7 pages.

International Search Report and Written Opinion for International Application No. PCT/EP2020/078019, dated Jan. 18, 2021, 12 pages (German).

German Examination Report for German Application No. 10 2019 215 503.0, dated Apr. 6, 2020 with machine translation, 12 pages.

German Examination Report for German Applicaion No. 10 2019 215 503.0, dated Oct. 12, 2020 with machine translation, 12 pages.

* cited by examiner

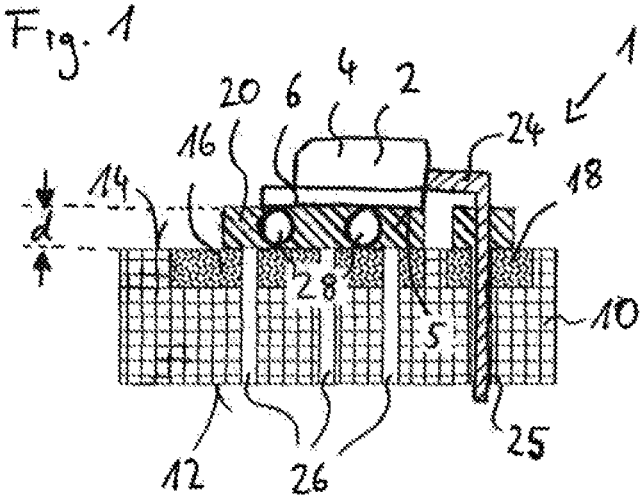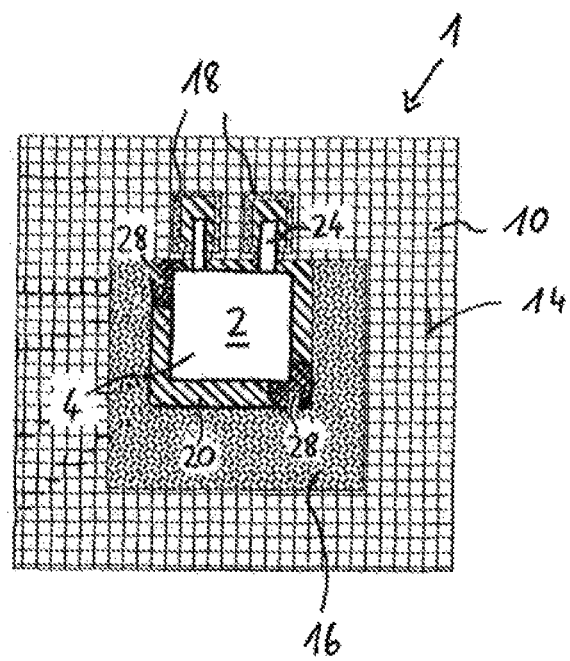

POWER SEMICONDUCTOR COMPONENT AND METHOD FOR PRODUCING A POWER SEMICONDUCTOR COMPONENT

CROSS REFERENCE TO RELATED APPLICATIONS

This application is the U.S. National Phase Application of PCT International Application No. PCT/EP2020/078019, filed Oct. 6, 2020, which claims priority to German Patent Application No. 10 2019 215 503.0, filed Oct. 10, 2019, the contents of such applications being incorporated by reference herein.

FIELD OF THE INVENTION

The present invention relates to a power semiconductor component having a power semiconductor device arranged within a housing, and also to a method for producing a power semiconductor component.

BACKGROUND OF THE INVENTION

Power semiconductor devices such as for example MOSFETs are arranged in housings, typically plastic housings, with cooling surfaces, for example made of copper, exposed on the outer side of the housing, there being a number of different housing designs, such as for example D2PAK, DPAK, TO220, etc. The devices are designed in some instances as surface-mountable devices and in some instances as through-hole-mountable devices. Said devices typically have at least two connection pins which are led out of the plastic housing and which can be connected to connections of a wiring substrate.

Since power semiconductor components having such power semiconductor devices emit large quantities of heat during operation, the efficient dissipation of this heat is a particular challenge. Typically, the heat is dissipated via the wiring substrate on which the packaged power semiconductor device is arranged. To this end, said wiring substrate may have thermal bores (vias), for example. Such a power semiconductor component is known from JP 2018-120991 A, incorporated herein by reference.

DE 11 2016 005 508 T5, incorporated herein by reference, also discloses the dissipation of heat via vias that can be completely or partially filled with solder. According to one embodiment, a solder resist which is applied around the vias and onto which the power semiconductor device is placed can prevent solder from flowing into the vias.

In some more recent applications, for example in chargers used in electric vehicles, very high power losses occur, such that cooling is of particular importance. In some instances, the use of thermal bores is also not possible in such applications due to electrical insulation regulations.

SUMMARY OF THE INVENTION

Therefore, an aspect of the present specifies a power semiconductor component which has a particularly effective dissipation of heat emitted by the power semiconductor device. It is also intended to specify a method for producing such a power semiconductor component.

According to one aspect of the invention, a power semiconductor component which has at least one power semiconductor device arranged within a housing is specified, wherein a heat sink is exposed on a first surface of the housing. The housing is in particular a plastic housing. The heat sink is formed in particular from metal. The housing may for example have substantially a cuboid shape.

The power semiconductor component also has a wiring substrate having a first main surface and a second main surface. The wiring substrate may in particular be a PCB substrate, that is to say a printed circuit board. In this case, the power semiconductor component is in particular a circuit board arrangement. A heat dissipation region with increased thermal conductivity is arranged on the second main surface. For example, the heat dissipation region is formed by a copper layer of the circuit board, said copper layer being arranged on the second main surface of the wiring substrate.

The housing is arranged on the wiring substrate in such a way that the heat sink is connected to the heat dissipation region via a solder layer. A number of spacers which are arranged between the heat sink and the heat dissipation region are embedded in the solder layer. The spacers are particularly advantageously formed from a material that has good electrical and thermal conductivity.

The spacers may in particular be SMD adhesive spots, that is to say quantities of SMD adhesive applied in a punctiform manner. An SMD adhesive is understood here to mean an adhesive which is used to fix surface-mountable components (surface-mount devices). Such adhesives, which may for example be electrically conductive adhesives based on epoxy resin, are known in principle to those skilled in the art and are therefore not explained in more detail at this point. The SMD adhesive spots can be arranged directly on the material of the heat dissipation region or on a solder resist web applied to the heat dissipation region.

The power semiconductor component has the advantage that, by using the spacers, a greater distance can be achieved between the housing and the wiring substrate, so that a thicker solder layer can be applied between the housing and the wiring substrate. This greatly increases the quantity of solder and thus the mass of material with good thermal conductivity on the wiring substrate. It can be increased in particular by one and a half times or can even be more than doubled. In this way, the heat is dissipated particularly effectively from the power semiconductor device and emitted to the environment.

In addition, the large quantity of material with good thermal conductivity in thermal contact with the heat sink constitutes a buffer in order to absorb temporary power peaks of the power semiconductor device that bring about a temporary rise in temperature.

The housing with the semiconductor device is arranged on the second main surface of the wiring substrate in such a way that the heat sink is arranged completely on the heat dissipation region and is connected thereto via a solder layer.

In addition, the thickness of the heat dissipation region can also be increased. Typically, with standard circuit board technology, a maximum of 70 micrometers of copper is available per layer, in some instances even up to 105 micrometers or up to 201 micrometers. This maximum thickness can be fully exploited for the heat dissipation region in order to maximize the heat-conducting mass.

According to one embodiment, the material forming the heat dissipation region, in particular copper or a copper alloy, is embedded in a matrix made of plastics material of the wiring substrate, and the surface of the heat dissipation region is thus coplanar with the rest of the surface of the wiring substrate. Alternatively, the heat dissipation region could also rest on a surface of the wiring substrate.

According to one embodiment, the power semiconductor device arranged in the housing is designed to be through-hole-mountable. In this embodiment, the power semiconductor device has connection pins which protrude from the housing and which are intended to be plugged into through-holes of the wiring substrate. Said connection pins are then soldered there. In this embodiment, it is possible to use the vias (through-holes) of the wiring substrate to introduce a large quantity of solder material between the heat sink and the heat dissipation region of the wiring substrate. According to one embodiment, the wiring substrate therefore has a number of vias in the heat dissipation region, through which vias the solder material is introduced between the heat sink and the heat dissipation region of the wiring substrate. In the case of such a wiring substrate, the spacers are applied between the vias so that they do not cover them.

This embodiment has the advantage that a large quantity of solder can be pumped under the housing using a THT (through-hole technology) soldering process. This makes it possible to achieve a high thickness of the solder layer, which would be possible only with difficulty in the case of a printed-on solder layer.

According to an alternative embodiment, the power semiconductor device arranged in the housing is designed to be surface-mountable. In this embodiment, connection pins also protrude from the housing, but are provided for soldering onto contact connection areas on the wiring substrate and not for plugging into through-holes.

In this embodiment, vias can nevertheless be provided in order to bring solder material under the housing. Alternatively, however, the housing with the power semiconductor device can be connected to the heat dissipation region by means of a solder wire or solder wire pieces after fixing by means of the spacers. In this embodiment, the solder layer is therefore introduced into the intermediate space between the housing and the heat dissipation region not by printing or pumping but by inserting pieces of solder wire. This embodiment also makes it possible to achieve a considerable thickness of the solder layer and thus a large heat-conducting mass.

According to one embodiment, the heat sink has an area a on the first surface and the heat dissipation region has an area A on the second main surface, where a <A applies. In particular, a <0.75 A or even a <0.5 A may apply. This embodiment has the advantage that the quantity of heat-conducting material is increased due to the large area of the heat dissipation region. In addition, the large heat dissipation region, which protrudes laterally beyond the housing with the power semiconductor device, achieves a particularly good heat spread. The dissipation of heat to the environment is thus improved.

According to one aspect of the invention, a method for producing the described power semiconductor component is specified, said method comprising providing a power semiconductor device arranged within a housing, wherein a heat sink is exposed on a first surface of the housing. A wiring substrate having a first main surface and a second main surface is also provided, wherein a heat dissipation region with increased thermal conductivity is arranged on the second main surface.

A number of spacers are applied to the wiring substrate in a mounting region of the heat dissipation region, and the housing with the power semiconductor device is placed onto the spacers in the mounting region. A solder material is introduced into an intermediate space between the heat sink and the heat dissipation region.

The region provided for receiving the housing with the power semiconductor device is referred to as the mounting region. It thus corresponds in terms of shape and extent to the first surface of the housing to be applied.

The introduction of solder material can be effected in through-hole technology by means of vias arranged in the wiring substrate. Alternatively, it can also be effected by introducing pieces of solder wire into the intermediate space between the heat sink and the heat dissipation region.

For example, adhesive spots of an SMD adhesive can be used as spacers.

The method has the advantage that it allows a particularly large quantity of solder to be applied to the heat dissipation region. This makes it possible to achieve solder layer thicknesses that could not be achieved, or could be achieved only with difficulty, with standard printing processes. In this way, a particularly large quantity of material with good thermal conductivity is brought into contact with the heat sink.

BRIEF DESCRIPTION OF THE DRAWINGS

Embodiments of the invention will be described by way of example below with reference to schematic drawings.

FIG. 1 schematically shows a power semiconductor component according to one embodiment of the invention in cross section, and FIG. 2 schematically shows the power semiconductor component as per FIG. 1 in a plan view.

DETAILED DESCRIPTION OF THE PREFERRED EMBODIMENTS

The power semiconductor component 1 as per FIG. 1 has a power semiconductor device 2, of which only a plastic housing 4 is shown in FIG. 1, and also connection pins 24 protruding from the plastic housing 4 and a heat sink 6 exposed on a first surface 5 of the housing 4. The power semiconductor device 2 additionally has at least one power semiconductor chip, for example a MOSFET, which is thermally and possibly also electrically connected to the heat sink 6. The power semiconductor device 2 is electrically contact-connected via the connection pins 24 and possibly via the heat sink 6.

The embodiment shown is a through-hole-mountable power semiconductor device 2. Alternatively, however, it could also be a surface-mountable power semiconductor device.

The power semiconductor component 1 also has a wiring substrate 10 which, in the embodiment shown, is designed as a PCB substrate and has a first main surface 12 and a second main surface 14 situated opposite the latter. The wiring substrate 10 comprises substantially a matrix made of plastic, in which contact connection areas 18 for the connection pins 24, conductor tracks (not illustrated) and a heat dissipation region 16 made of copper are embedded. The heat dissipation region 16 is exposed on a second main surface 14 of the wiring substrate 10 and is provided for receiving the power semiconductor device 2 and for establishing thermal (and possibly also electrical) contact with the heat sink 6.

The wiring substrate 10 has a number of vias 25, 26. In this case, vias 25 in the region of contact connection areas 18 are provided as electrical vias through which the connection pins 24 are led. Vias 26 in the region of the heat dissipation region 16 are embodied as thermal vias and are used, among other things, to dissipate heat.

A solder layer 20 for the electrical and mechanical connection of the power semiconductor device 2 and the wiring substrate 10 is applied both to the heat dissipation region 16 and to the contact connection areas 8. The power semiconductor device 2, in particular the heat sink 6, is connected to the heat dissipation region 16 in an electrically and thermally conductive manner via the solder layer 20. The connection pins 24 are connected to the contact connection areas 18 in an electrically and thermally conductive manner via the solder layer 20.

The solder layer 20 has a high thickness d. It is therefore not printed, as is otherwise usually customary, onto the wiring substrate 10. Rather, the housing 4 with the power semiconductor device 2 is first placed onto the heat dissipation region 16, and fixed there, by means of spacers 28 which are SMD adhesive spots in the embodiment shown. The housing 4 or the heat sink 6 exposed on its first surface 5 is then soldered to the heat dissipation region 16 by means of through-hole technology. In this case, solder material for the solder layer 20 is introduced from the first main surface 12 through the vias 26 into the intermediate space between the heat sink 6 and the wiring substrate 10. At the same time, the solder layer 20 can also be applied to the contact connection areas 18 through the vias 25. However, since this does not have to have a particularly great thickness, it can also be printed on using a standard process.

Here, the quantity of solder and the pressure with which the solder is brought into the intermediate space are controlled in such a way that the solder layer 20 fills substantially the entire intermediate space between the heat sink 6 and the wiring substrate 10. The vias 26 can also be filled with solder material or they can be kept free or filled with another material which preferably has good thermal conductivity.

FIG. 2 shows the power semiconductor component 1 in a plan view. It can be seen in this view that the heat dissipation region 16 has a significantly larger areal extent than the housing 4 or the heat sink 6, which is not visible in FIG. 2. In the embodiment shown, the area A of the heat dissipation region 16 is more than twice as large as the area a of the heat sink 6 that is exposed on the first surface 5 of the housing 4.

As can be seen in FIG. 2, the heat dissipation region 16 thus protrudes laterally to a significant extent beyond the housing 4. In the embodiment shown in FIG. 2, said heat dissipation region protrudes beyond the housing 4 on all sides.

The copper material of the heat dissipation region 16 and also the solder material of the solder layer 20 form an increased thermal mass, which can both buffer temporary temperature increases due to power peaks and, owing to its large spatial extent, can achieve a good heat spread.

The invention claimed is:

1. A power semiconductor component, comprising:
a power semiconductor device arranged within a housing;
a heat sink exposed on a first surface of the housing; a wiring substrate which receives the housing with the power semiconductor device and which has a first main surface and a second main surface;
a heat dissipation region arranged on the second main surface, wherein the housing is arranged on the wiring substrate in such a way that the heat sink is connected to the heat dissipation region via a solder layer;
a number of spacers arranged between the heat sink and the heat dissipation region, wherein the number of spacers are embedded in the solder layer, wherein the spacers are formed from a surface mount device ("SMD") adhesive, wherein the SMD adhesive comprises an electrically conductive adhesive based on epoxy resin; and
a number of vias arranged in the wiring substrate, wherein the number of vias are configured to introduce solder material between the heat sink and the heat dissipation region of the wiring substrate.

2. The power semiconductor component as claimed in claim 1, wherein the power semiconductor device arranged in the housing is designed to be through-hole-mountable.

3. The power semiconductor component as claimed in claim 1, wherein the power semiconductor device arranged in the housing is designed to be surface-mountable.

4. The power semiconductor component as claimed in claim 1, wherein the housing with the power semiconductor device is electrically connected to the heat dissipation region by means of the spacers and by means of a solder layer.

5. The power semiconductor component as claimed in claim 1, wherein the heat sink has an area a on the first surface and the heat dissipation region has an area A on the second main surface, where a <A applies.

6. The power semiconductor component as claimed in claim 1, wherein the heat dissipation region protrudes beyond the housing of the power semiconductor device on all sides.

7. The power semiconductor component as claimed in claim 1, wherein the heat dissipation region comprises a copper layer.

* * * * *

UNITED STATES PATENT AND TRADEMARK OFFICE
CERTIFICATE OF CORRECTION

PATENT NO. : 11,955,402 B2
APPLICATION NO. : 17/608888
DATED : April 9, 2024
INVENTOR(S) : Christina Quest-Matt Page 1 of 1

It is certified that error appears in the above-identified patent and that said Letters Patent is hereby corrected as shown below:

On the Title Page

Item (73) Assignee, Please change "VITESCO TECHNOLOGIES GBMH" to --VITESCO TECHNOLOGIES GMBH--

Signed and Sealed this
Eighth Day of April, 2025

Coke Morgan Stewart
*Acting Director of the United States Patent and Trademark Office*